(12) United States Patent
Yuan et al.

(10) Patent No.: US 11,481,699 B2
(45) Date of Patent: Oct. 25, 2022

(54) METHOD AND DEVICE FOR ESTIMATING THE LIFECYCLE OF A COMPONENT

(71) Applicants: Siemens Aktiengesellschaft, Munich (DE); Yong Yuan, Beijing (CN); Xiao Feng Wang, Beijing (CN); Wen Jing Zhou, Wuxi (CN)

(72) Inventors: Yong Yuan, Beijing (CN); Xiao Feng Wang, Beijing (CN); Wen Jing Zhou, Wuxi (CN)

(73) Assignee: Siemens Aktiengesellschaft, Munich (DE)

( * ) Notice: Subject to any disclaimer, the term of this patent is extended or adjusted under 35 U.S.C. 154(b) by 445 days.

(21) Appl. No.: 16/497,548

(22) PCT Filed: Mar. 28, 2017

(86) PCT No.: PCT/CN2017/078357
§ 371 (c)(1),
(2) Date: Sep. 25, 2019

(87) PCT Pub. No.: WO2018/176203
PCT Pub. Date: Oct. 4, 2018

(65) Prior Publication Data
US 2020/0027040 A1    Jan. 23, 2020

(51) Int. Cl.
*G06Q 10/04* (2012.01)
*G06F 30/20* (2020.01)
(Continued)

(52) U.S. Cl.
CPC .............. *G06Q 10/04* (2013.01); *G06F 30/20* (2020.01); *G06Q 10/0631* (2013.01);
(Continued)

(58) Field of Classification Search
CPC ............... G06Q 10/04; G06Q 10/0631; G06Q 10/06375; G06Q 10/0875; G06Q 10/20; G06F 30/20
(Continued)

(56) References Cited

U.S. PATENT DOCUMENTS

| 7,389,921 B2 * | 6/2008 | Lin | ........................ | G06Q 10/08 |
|---|---|---|---|---|
| | | | | 235/375 |
| 8,126,581 B2 * | 2/2012 | Kostyk | .................. | G06Q 10/04 |
| | | | | 700/110 |

(Continued)

FOREIGN PATENT DOCUMENTS

| CN | 102095573 A | 6/2011 |
|---|---|---|
| CN | 102402727 A | 4/2012 |

(Continued)

OTHER PUBLICATIONS

Helbig et al. ("A method for estimating and evaluating life cycle costs of decentralized component-based automation solutions", Procedia CIRP 17 (2014) 332-337) (Year: 2014).*

(Continued)

*Primary Examiner* — Iftekhar A Khan
(74) *Attorney, Agent, or Firm* — Harness, Dickey & Pierce, P.L.C.

(57) ABSTRACT

The present disclosure provides a method and device for assessing a lifecycle of a component. In an embodiment, the method includes: obtaining, using a simulation device, model description information that corresponds to component models of some or all components in the production line; obtaining at least one piece of data information that is needed by at least one component model that corresponds to the model description information; performing event marking based on the event information on the obtained data information; obtaining component status information of a corresponding component of each model based on the (Continued)

marked data information; and generating a corresponding analysis report based on the component status information from. An advantage of an embodiment is that, a failure mode, a key module, and a measurement rule no longer rely on manual operations and experience of an expert. Instead corresponding information may be precisely provided by using a PLM system.

16 Claims, 2 Drawing Sheets

(51) Int. Cl.
    *G06Q 10/06*     (2012.01)
    *G06Q 10/08*     (2012.01)
    *G06Q 10/00*     (2012.01)

(52) U.S. Cl.
    CPC ... *G06Q 10/06375* (2013.01); *G06Q 10/0875* (2013.01); *G06Q 10/20* (2013.01)

(58) Field of Classification Search
    USPC ............................................................. 703/2
    See application file for complete search history.

(56) References Cited

U.S. PATENT DOCUMENTS

| | | | | |
|---|---|---|---|---|
| 9,032,329 | B2* | 5/2015 | Sadouski | G06F 3/0481 |
| | | | | 715/810 |
| 9,449,323 | B2* | 9/2016 | Mikan | G06Q 30/0269 |
| 10,397,662 | B1* | 8/2019 | Bulusu | H04N 21/84 |
| 2003/0109951 | A1* | 6/2003 | Hsiung | G05B 15/02 |
| | | | | 700/96 |
| 2006/0224254 | A1* | 10/2006 | Rumi | G05B 13/0275 |
| | | | | 700/28 |
| 2007/0063029 | A1* | 3/2007 | Brandt | G06Q 10/08 |
| | | | | 235/376 |
| 2010/0049494 | A1* | 2/2010 | Radibratovic | G06Q 10/04 |
| | | | | 703/13 |
| 2010/0205192 | A1* | 8/2010 | Quadracci | G06F 16/2465 |
| | | | | 707/758 |
| 2011/0264591 | A1* | 10/2011 | Song | G06Q 10/101 |
| | | | | 705/300 |
| 2012/0166249 | A1* | 6/2012 | Jackson | G06Q 10/0635 |
| | | | | 705/7.28 |
| 2013/0304439 | A1* | 11/2013 | Van der Velden | G06F 30/20 |
| | | | | 703/6 |
| 2013/0304440 | A1* | 11/2013 | Van der Velden | G06Q 10/067 |
| | | | | 703/6 |
| 2016/0004791 | A1* | 1/2016 | Hollmann | G06F 30/00 |
| | | | | 700/98 |
| 2017/0185968 | A1* | 6/2017 | Langley | G06Q 10/20 |
| 2017/0192414 | A1* | 7/2017 | Mukkamala | H04L 63/0876 |
| 2017/0351244 | A1* | 12/2017 | Wolf | G05B 19/4063 |
| 2018/0081345 | A1* | 3/2018 | Mailman | G05B 19/41865 |
| 2018/0284758 | A1* | 10/2018 | Celia | G01M 13/028 |
| 2019/0034458 | A1* | 1/2019 | Vinnik | G06Q 10/06 |
| 2019/0142349 | A1* | 5/2019 | Schorey | A61B 5/7282 |
| | | | | 600/546 |
| 2020/0065726 | A1* | 2/2020 | Gibbons | G06F 40/174 |
| 2020/0348662 | A1* | 11/2020 | Cella | H04B 17/309 |
| 2021/0178575 | A1* | 6/2021 | Riek | B25J 9/08 |

FOREIGN PATENT DOCUMENTS

| | | |
|---|---|---|
| CN | 103728965 A | 4/2014 |
| CN | 104850748 A | 8/2015 |
| CN | 105372517 A | 3/2016 |
| WO | WO 2010019962 A2 | 2/2010 |
| WO | WO 2016041075 A1 | 3/2016 |

OTHER PUBLICATIONS

Andersson et al. (Evaluation of Methods Used for Life-Cycle Assessments in Discrete Event Simulation, IEEE, 2012, pp. 1-12) (Year: 2012).*

Yongxin Liao ("Semantic annotations for systems interoperability in a PLM environment", Université de Lorraine 2013, pp. 1-156) (Year: 2013).*

International Search Report PCT/ISA/210 for International Application No. PCT/CN2017/078357 filed Mar. 28, 2017.

Written Opinion of the International Searching Authority PCT/ISA/237 for International Application No. PCT/CN2017/078357 filed Mar. 28, 2017.

Extended European Search Report dated Nov. 24, 2020.

* cited by examiner

METHOD AND DEVICE FOR ESTIMATING THE LIFECYCLE OF A COMPONENT

PRIORITY STATEMENT

This application is the national phase under 35 U.S.C. § 371 of PCT International Application No. PCT/CN2017/078357 which has an International filing date of Mar. 28, 2017, which designated the United States of America, the entire contents of which are hereby incorporated herein by reference.

FIELD

Embodiments of the present invention generally relate to the field of the Industrial Internet, and in particular, to a method and device for assessing a lifecycle of a component.

BACKGROUND

To reduce the maintenance costs and provide reliable product and operating models, small and medium enterprises (SMEs) have a very urgent demand on a product data service. For example, an SME that establishes an assembly line adopts a preventive maintenance service, to obtain data from key modules in a production line, send the data to a cloud, and analyze the key modules by using an analysis algorithm, to predict possible failure situations of the key modules. In this way, the maintenance costs are reduced, a stock of surplus components is reduced, and components can be replaced in time, to reduce a system risk of the production line.

The Industrial Internet makes the product data service more convenient. However, to implement the product data service in a specific production field, the following several steps need to be performed: 1) initiating a failure mode and impact analysis of a client factory, to determine a key module and a failure mode of the key module in a production line; 2) determining a measurement rule, including installation of a sensor, preprocessing of data of the sensor, and the like; 3) installing the sensor on the scene and obtaining software/hardware of the data; 4) configuring a parameter of a cloud connector, and describing, on a cloud platform, an association relationship of components in the factory; 5) configuring a report template and a visual interface; and 6) providing a report and a visual interface according to an analysis result.

SUMMARY

The inventors have discovered that it is not easy to implement the method in practice due to the following reasons:
1) determining of a key module and a failure mode of the key module highly relies on experience of an expert;
2) a measurement rule highly relies on experience of an expert; and
3) quality of an analysis report and a visual interface highly relies on experience of an expert.

In addition, the inventors have discovered that a current analysis manner is mainly a manner that adopts a black box, and because a key module needs to rely on data sampling performed in a normal mode and a failure mode, it is not easy a black box for each different component.

In view of this, one of the problems that are to be resolved by embodiments of the present invention is to implement automatic assessment of a lifecycle of a component, to avoid excessive dependence on experience of an expert.

According to an embodiment of the present invention, a method for assessing a lifecycle of a component is provided. The assessment device includes a simulation device configured to perform simulation and modeling on each component in a production line. The method includes the following steps:
- obtaining, by using the simulation device, model description information that corresponds to some or all components in the production line, where the model description information includes at least one data element that corresponds to at least one component model and that needs to be collected by the at least one component model, and event information that corresponds to each data element;
- obtaining at least one piece of data information that is needed by at least one component model that corresponds to the model description information;
- performing event marking on the obtained data information based on the event information;
- obtaining component status information of a corresponding component of each model based on the marked data information; and
- generating a corresponding analysis report based on the component status information from.

According to an embodiment of the present invention, an assessment device for assessing a lifecycle of a component is further provided. The assessment device includes a simulation device configured to perform simulation and modeling on each component in a production line. The assessment device includes:
- the simulation device, configured to obtain model description information that corresponds to some or all components in the production line, where the model description information includes at least one data element that corresponds to at least one component model and that needs to be collected by the at least one component model, and event information that corresponds to each data element;
- a data obtaining device, configured to obtain at least one piece of real data information that is needed by at least one component model that corresponds to the model description information; and perform event marking on the obtained real data information based on the event information;
- a status monitoring device, configured to obtain component status information of a corresponding component of each model based on the marked data information; and
- an analysis device, configured to generate a corresponding analysis report based on the component status information from.

Embodiments of the present invention may have one or more of the following advantages: by simulating a production line, and outputting a data element and an event rule that are needed by a key module, a system can be automatically directed to obtain corresponding real data, and suitable data can be automatically collected and preprocessed. The real data is collected for calibration of a product lifecycle management (PLM) system, so that a close loop is formed. In this way, a simulation model of the entire production line is more practical. In addition, a failure mode, a key module, and a measurement rule no longer rely on manual operations and experience of an expert, and instead corresponding information may be precisely provided by using the PLM system. In addition, by performing semantic processing on a model, a user can be supported to perform a remote operation, to better adapt to diversified office scenarios.

BRIEF DESCRIPTION OF THE DRAWINGS

Other features and advantages of the present invention will become more apparent from the following detailed description taken in conjunction with the accompanying drawings.

DETAILED DESCRIPTION OF EXAMPLE EMBODIMENTS

The following will describe in a more detailed manner the preferred implementations of the present disclosure with reference to the accompanying drawings. Although the preferred implementations of the present disclosure are displayed in the accompanying drawings, it should be understood that the present disclosure can be implemented in various manners and should not be limited to the implementations described herein. On the contrary, the implementations are provided to make the present disclosure more thorough and complete, and to fully convey the scope of the present disclosure to a person skilled in the art.

Figure 1:
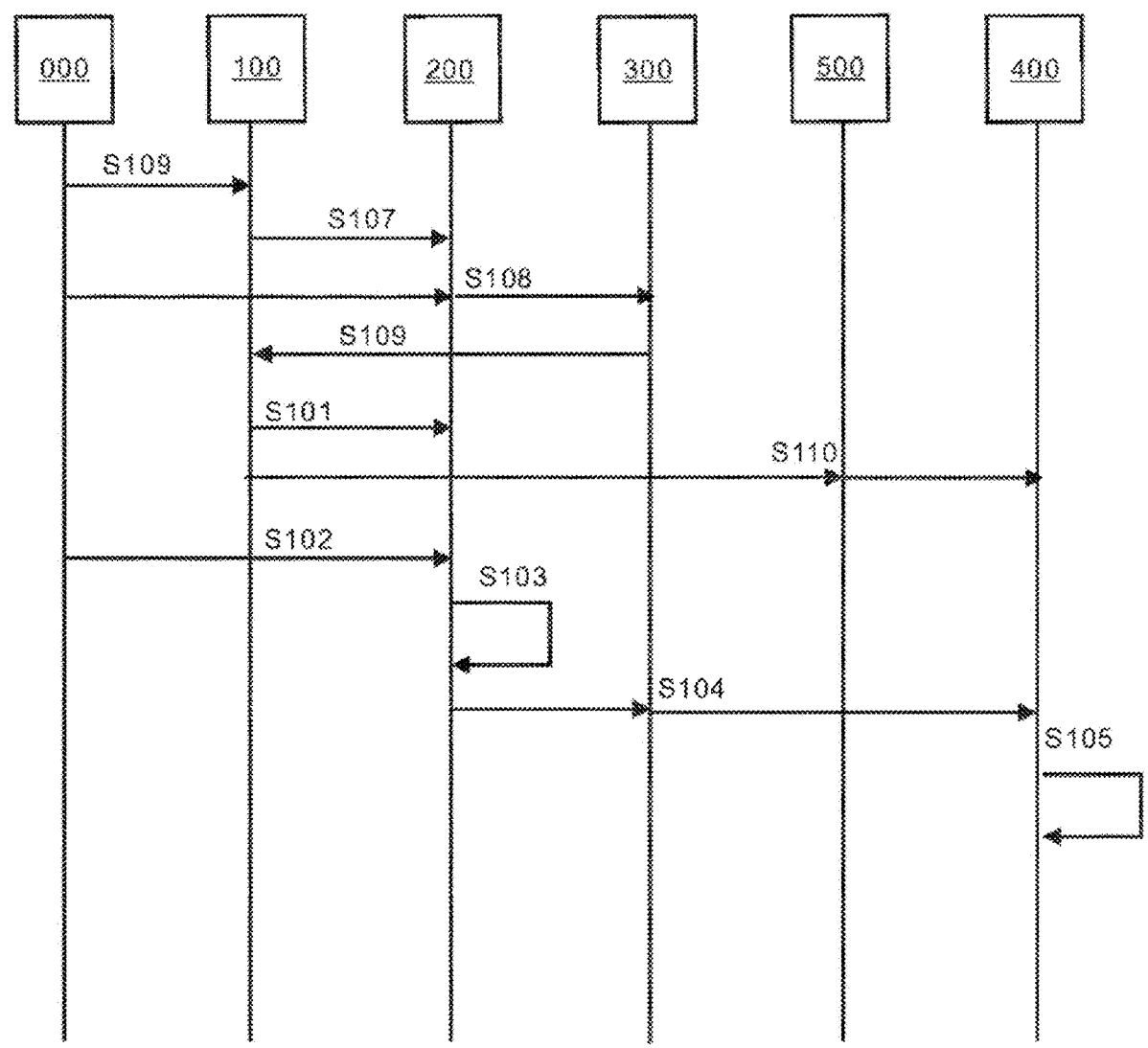
FIG. 1 is a flowchart of a method for assessing a lifecycle of a component according to an embodiment of the present invention.

Referring to FIG. 1, FIG. 1 shows an assessment device for assessing a lifecycle of a component according to an embodiment of the present invention. The assessment device according to the present invention includes a simulation device 100, a data obtaining device 200, a status monitoring device 300, and an analysis device 400. Preferably, the assessment device according to the present invention further includes a semantic device 500.

Descriptions are given below by using embodiments.

According to an embodiment of the present invention, step S101 performed by the simulation device 100, steps S102 and S103 performed by the data obtaining device 200, step S104 performed by the status monitoring device 300, and step S105 performed by the analysis device 400 are included.

The simulation device is configured to perform simulation and modeling on each component in a production line. Preferably, the simulation device performs modeling on each component in the production line of a factory by using PLM software, and generates corresponding simulation data for a corresponding model of each component to run.

Specifically, in step S101, the assessment device obtains, by using the simulation device, model description information that corresponds to a component model of at least one component in the production line.

The model description information includes at least one data element that needs to be collected by the component model and event information that corresponds to some or all of the data elements.

An event that corresponds to the event information is used to distinguish a normal mode and a failure mode when the component model runs.

Preferably, for any component model, the assessment device extracts, according to simulation running of the component model in a normal mode and a failure mode, rule information that corresponds to the component model. The rule information includes used to event information and data information that corresponds to the event.

The event information is used to distinguish a normal mode and a failure mode.

Specifically, a component model in the simulation device of the assessment device performs simulation running based on a plurality of groups of simulation data, including simulation data in the normal mode and simulation data in the failure mode, obtains a plurality of running results, and extracts, in a data processing manner such as data mining, the event information used to distinguish the normal mode and the failure mode and the data element corresponding to the event information, to use the event information and the data element as the rule information.

For example, when performing simulation running, a motor model runs based on three pieces of simulation data, that is, temperature, rotational speed, and whether being on-load, to obtain a corresponding vibration value. The simulation device determines a vibration value in the failure mode according to a normal value range of the vibration value, and determines, by mining related data information that affects the vibration value, that the event information used to distinguish the normal mode and the failure mode is loaded, and further determines that the rule includes an on-load vibration data. It is determined, according to the corresponding data element, that the rule includes an on-load vibration value, it is further determined that the event information is on-load, and it is determined that the data element that needs to be obtained includes temperature, rotational speed, whether being on-load, and vibration.

Preferably, the assessment device performs simulation running by using the simulation device, to determine, based on an association relationship among each component in the production line and/or a corresponding failure mode during the running, at least one key module in the production line, to obtain model description information of the at least one key module.

For example, the simulation device may determine, based on an association relationship between one component and the other component, a component located in a key node as the key module; for another example, the simulation device may determine a component that has many failure modes and that is frequently happened as the key module, and the like.

Then, the assessment device obtains model description information that is of at least one model and that is from the simulation device, and in step S102, the assessment device obtains at least one piece of real data information that corresponds to the model description information of each model.

The assessment device has an interface that connects to each component in an actual production line, to obtain data information related to each component.

Preferably, the assessment device connects, by using the interface, to devices configured to collect data such as a sensor in each actual component, to obtain real data of the component collected by the devices.

Then, in step S103, the assessment device performs event marking on the obtained data information based on the event information.

Preferably, the assessment device preprocesses the obtained data information, to perform event marking on the preprocessed data information.

The preprocessing includes but is not limited to a plurality of possible data processing, such as filtering processing and root-mean-square finding.

The assessment device may determine, according to a data type, a data source, or the like, a preprocessing operation to be performed on the data. More preferably, the data may be preprocessed based on a preprocessing rule predetermined during component modeling.

Then, in step S104, the assessment device obtains component status information of a corresponding component of each model based on the marked data information.

The running status information is used to indicate that the component model is in a normal mode or a failure mode. Preferably, the running status information includes a probability that the component model is in a normal mode/a failure mode. More preferably, the running status information further includes other related information indicating that the component model is normal/failure. Specifically, the assessment device determines, based on the event marking included in the data information, component status information of a component that corresponds to the data information.

Then, in step S105, the assessment device generates, based on the component status information from the status monitoring device, a corresponding analysis report.

Specifically, the assessment device predicts, based on the obtained component status information of each component model and historically obtained component status information, a lifecycle of the component, to generate a corresponding analysis report based on the predicted lifecycle.

Preferably, the assessment device further obtains other component related information of the component, and predicts a lifecycle of the component with reference to the component status information of the component model and the running status information of the component, to generate a corresponding analysis report based on the predicted lifecycle.

The component related information includes each piece of information used by the assessment device to predict a lifecycle of a component.

Preferably, the component related information includes but is not limited to at least one of the following:
1) health indicator information of a component, such as an aging degree, a wear degree, and deformation of the component;
2) running time and the like of the component; and
3) position information of the component in a production line and the like.

According to a first embodiment of the present invention, a component model is a motor model. It is already known that in a PLM system the model is in a failure mode when a rotational speed is greater than 100 rpm/minute, and vibration is sensitive to the rotational speed.

The following two failure modes determined by using simulation running of the model are:
1) bearing failure: Vib=f1(Speed, Torque, Temperature); and
2) drive bearing failure: Vib=f2(Speed, Torque, Temperature), where Vib represents a vibration data element, Speed represents a speed, Torque represents a torque, Temperature represents a temperature, f1 represents a function that corresponds to a failure mode of a bearing, and f2 represents a function that corresponds to a failure mode of a drive bearing.

The assessment device abstractly determines in step S102 that model description information that corresponds to the model and that needs to be obtained includes: the data element, including: speed, torque, temperature, and vibration; and the rule information, including vibration data whose speed is greater than 100 rpm/minute.

In step S103, the assessment device obtains, from a sensor of an actual motor, real data value that corresponds to four data elements, and marks vibration data that satisfies the event information as a symbol event_1. Event content corresponding to the symbol is "a speed is greater than 100 rpm/minute".

Then, the assessment device obtains, by using step S104, data information that corresponds to the motor model, and determines component status information of the motor based on the obtained information; and predicts a lifecycle of the motor by using step S105 and based on the determined component status information.

Further referring to FIG. 1, in a preferable embodiment, the method according to this embodiment further includes step S110 and step S105'.

In step S110, the assessment device sends position semantic information of a corresponding component to the analysis device.

The position semantic information represents information obtained by performing semantic processing on a position association information among components. Preferably, the position association information includes a relative position relationship among each component such as above-below, left-right, and front-back.

Preferably, after the assessment device establishes/updates simulation and modeling of the production line, the semantic device reads a position association information among each component model in the simulation device, and performs semantic processing, to obtain position semantic information of the position association information among each component.

Specifically, the assessment device determines, by reading a related file of each component model in the simulation and modeling of the production line, position association information among each component model, and when the model is changed, updates the corresponding position association information by reading a file of each changed component model.

Then, in step S105', the assessment device generates, based on the component status information from the status monitoring device and the corresponding position semantic information of the corresponding component, a corresponding analysis report.

The analysis report may include at least one piece of the following information:
1) information about a lifecycle of a component;
2) information about a data element of the component; and
3) a lifecycle of a production line.

According to a preferred solution of this embodiment, the assessment device has a remote client, and the assessment device provides association semantic information that corresponds to each component to the remote client.

Specifically, when a user checks the running status and the analysis report of the assessment device by using the remote client, the assessment device may send analysis data and position semantic information that are needed to the remote client to be checked by the user.

For example, the assessment device may separately send the analysis data and position semantic information that are needed to a cloud, so that the remote client obtains corresponding data.

According to the solution of this embodiment, complete automatic assessment can be implemented without relying on experience of an expert. In addition, by performing semantic processing on a model, a user can be supported to perform a remote operation, to better adapt to diversified office scenarios.

Still referring to FIG. 1, according to a preferred solution of the present invention, before step S101, step S106, step S107, step S108, and step S109 are further included.

In step S106, the assessment device establishes, based on the simulation device, a corresponding component model of each component in the production line.

In step S107, the assessment device obtains corresponding real data information of each component model in the simulation device.

In step S108, the assessment device generates, based on each component model in the simulation device and the corresponding real data information of each component model, corresponding model data of each component model.

The model data includes data information that includes model information. The assessment device obtains the model data by packaging the model information and real data information.

For example, the model information may include a device name, information about a sensor of the device, a data attribute obtained by the sensor, and the like that correspond to real data information. A person skilled in the art may determine, according to an actual situation and demand, model information that needs to be adopted in the model data. Specifically, the assessment device consolidates, based on a data format that is needed by each component model, corresponding real data information of the component model, to obtain corresponding model data.

Then, in step S109, the assessment device calibrates the corresponding component model of each component based on the model data.

A person skilled in the art should be able to obtain a manner of calibrating a model based on model data. This is not described herein again.

According to the solution in this embodiment, by simulating a production line, and outputting a data element and an event rule that are needed by a key module, a system can be automatically directed to obtain corresponding real data, and suitable data can be automatically collected and pre-processed. The real data is collected for calibration of a PLM system, so that a close loop is formed. In this way, a simulation model of the entire production line is more practical. In addition, a failure mode, a key module, and a measurement rule no longer rely on manual operations and experience of an expert, and instead corresponding information may be precisely provided by using the PLM system.

Figure 2:
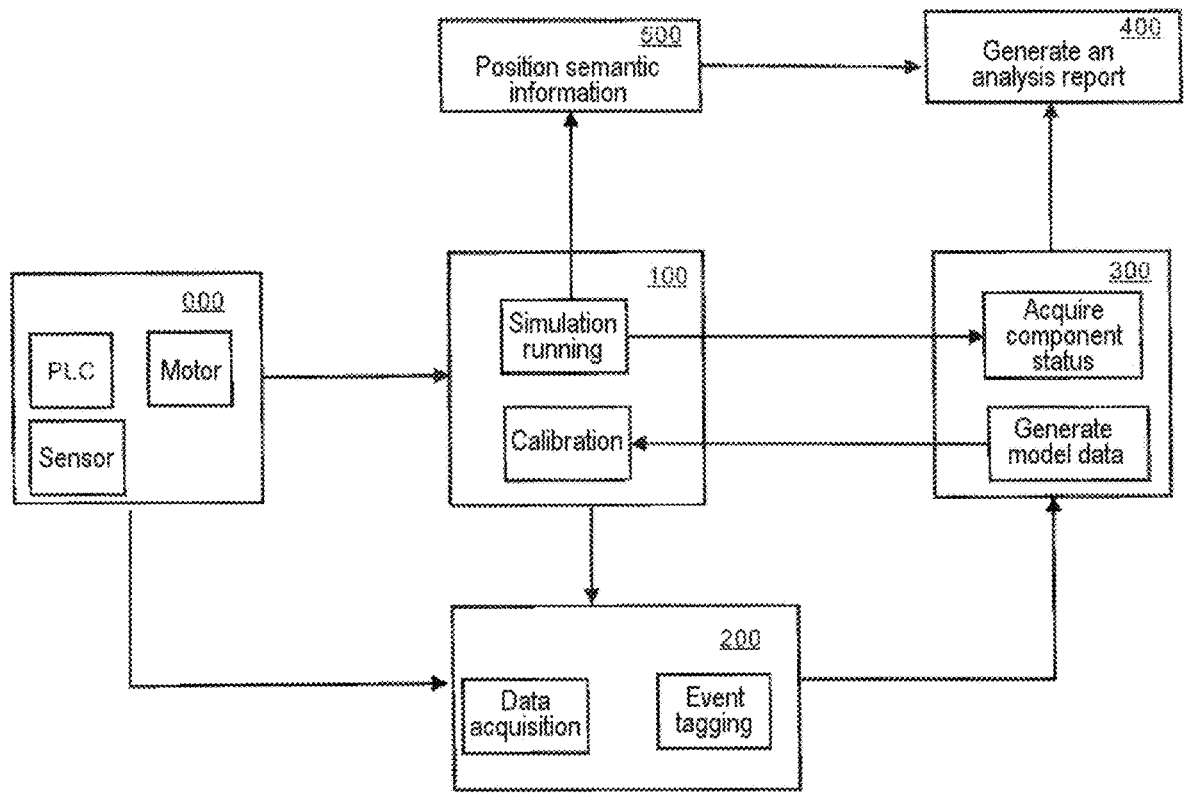
FIG. 2 is a structural block diagram of an assessment device for assessing a lifecycle of a component according to an embodiment of the present invention.

FIG. 2 is a structural block diagram of an assessment device for assessing a lifecycle of a component according to an embodiment of the present invention. The assessment device according to the present invention includes a simulation device 100, a data obtaining device 200, a status monitoring device 300, and an analysis device 400. Preferably, the assessment device according to the present invention further includes a semantic device 500.

The simulation device 100 is configured to perform simulation and modeling on each component in a production line. Preferably, the simulation device 100 performs modeling on each component in the production line of a factory by using PLM software, and generates corresponding simulation data for a corresponding model of each component to run.

Specifically, the simulation device 100 obtains model description information that corresponds to a component model of at least one component in the production line.

The model description information includes at least one data element that needs to be collected by the component model and event information that corresponds to some or all of the data elements.

An event that corresponds to the event information is used to distinguish a normal mode and a failure mode when the component model runs.

Preferably, for any component model, the simulation device 100 extracts, according to simulation running of the component model in a normal mode and a failure mode, rule information that corresponds to the component model. The rule information includes used to event information and data information that corresponds to the event.

The event information is used to distinguish a normal mode and a failure mode.

Specifically, a component model in the simulation device 100 performs simulation running based on a plurality of groups of simulation data, including simulation data in the normal mode and simulation data in the failure mode, obtains a plurality of running results, and extracts, in a data processing manner such as data mining, the event information used to distinguish the normal mode and the failure mode and the data element corresponding to the event information, to use the event information and the data element as the rule information.

For example, when performing simulation running, a motor model runs based on three pieces of simulation data, that is, temperature, rotational speed, and whether being on-load, to obtain a corresponding vibration value. The simulation device 100 determines a vibration value in the failure mode according to a normal value range of the vibration value, and determines, by mining related data information of an image vibration value, that the event information used to distinguish the normal mode and the failure mode is loaded, and further determines that the rule includes an on-load vibration data. It is determined, according to the corresponding data element, that the rule includes an on-load vibration value, it is further determined that the event information is on-load, and it is determined that the data element that needs to be obtained includes temperature, rotational speed, whether being on-load, and vibration.

Preferably, the simulation device 100 performs simulation running, to determine, based on an association relationship among each component in the production line and/or a corresponding failure mode during the running, at least one key module in the production line, to obtain model description information of the at least one key module.

For example, the simulation device 100 may determine, based on an association relationship between one component and the other component, a component located in a key node as the key module; for another example, the simulation device may determine a component that has many failure modes and that is frequently happened as the key module, and the like.

Then, the data obtaining device 200 receives model description information that is of at least one model and that is from the simulation device 100, and obtains at least one piece of real data information that corresponds to the model description information of each model.

The data obtaining device 200 has an interface that connects to each component in an actual production line, to obtain data information related to each component.

Preferably, the data obtaining device 200 connects, by using the interface, to devices configured to collect data such as a sensor in each actual component, to obtain real data of the component collected by the devices.

Then, the data obtaining device 200 performs event marking on the obtained data information based on the event information.

Preferably, the data obtaining device 200 preprocesses the obtained data information, to perform event marking on the preprocessed data information.

The preprocessing includes but is not limited to a plurality of possible data processing, such as filtering processing and root-mean-square finding.

The data obtaining device 200 may determine, according to a data type, a data source, or the like, a preprocessing operation to be performed on the data. More preferably, the data may be preprocessed based on a preprocessing rule predetermined during component modeling.

Then, the status monitoring device 300 obtains component status information of a corresponding component of each model based on the marked data information.

The running status information is used to indicate that the component model is in a normal mode or a failure mode. Preferably, the running status information includes a probability that the component model is in a normal mode/a failure mode. More preferably, the running status information further includes other related information indicating that the component model is normal/failure.

Specifically, the assessment device determines, based on the event marking included in the data information, component status information of a component that corresponds to the data information.

Specifically, the status monitoring device 300 detects, according to data information that corresponds to a failure mode and a normal mode of a component module and that is in the simulation device, a running status of the corresponding component, so that the analysis device 400 predicts, based on the running status, a lifecycle of the component.

Then, the analysis device 400 generates, based on the component status information from the status monitoring device, a corresponding analysis report.

Specifically, the analysis device 400 predicts, based on the obtained component status information of each component model and historically obtained component status information, a lifecycle of the component, to generate a corresponding analysis report based on the predicted lifecycle.

Preferably, the analysis device 400 further obtains other component related information of the component, and predicts a lifecycle of the component with reference to the component status information of the component model and the running status information of the component, to generate a corresponding analysis report based on the predicted lifecycle.

The component related information includes each piece of information used by the assessment device to predict a lifecycle of a component.

Preferably, the component related information includes but is not limited to at least one of the following:
1) health indicator information of a component, such as an aging degree, a wear degree, and deformation of the component;
2) running time and the like of the component; and
3) position information of the component in a production line and the like.

According to a first embodiment of the present invention, a component model is a motor model. It is already known that in a PLM system the model is in a failure mode when a rotational speed is greater than 100 rpm/minute, and vibration is sensitive to the rotational speed.

The following two failure modes determined by using simulation running of the model are:
1) bearing failure: Vib=f1(Speed, Torque, Temperature); and
2) drive bearing failure: Vib=f2(Speed, Torque, Temperature), where Vib represents a vibration data element, Speed represents a speed, Torque represents a torque, Temperature represents a temperature, f1 represents a function that corresponds to a failure mode of a bearing, and f2 represents a function that corresponds to a failure mode of a drive bearing.

The data obtaining device 200 abstractly determines that model description information that corresponds to the model and that needs to be obtained includes: the data element, including: speed, torque, temperature, and vibration; and the rule information, including vibration data whose speed is greater than 100 rpm/minute.

The data obtaining device 200 obtains, from a sensor of an actual motor, real data value that corresponds to four data elements, and marks vibration data that satisfies the event information as a symbol event_1. Event content corresponding to the symbol is "a speed is greater than 100 rpm/minute".

Then, the status monitoring device 300 obtains data information that corresponds to the motor model, and determines component status information of the motor based on the obtained information; and the analysis device 400 predicts a lifecycle of the motor based on the determined component status information.

Further referring to FIG. 2, in a preferable embodiment, the assessment device according to this embodiment further includes a semantic device 500.

The semantic device 500 sends corresponding position semantic information of a component to the analysis device 400.

The position semantic information represents information obtained by performing semantic processing on a position association information among components. Preferably, the position association information includes a relative position relationship among each component such as above-below, left-right, and front-back.

Preferably, after the simulation device establishes/updates simulation and modeling of the production line, the semantic device 500 reads a position association information among each component model in the simulation device, and performs semantic processing, to obtain position semantic information of the position association information among each component.

Specifically, the semantic device 500 determines, by reading a related file of each component model in the simulation and modeling of the production line, position association information among each component model, and when the model is changed, updates the corresponding position association information by reading a file of each changed component model.

Then, the analysis device 400 generates, based on the component status information from the status monitoring device and the corresponding position semantic information of the corresponding component, a corresponding analysis report.

The analysis report may include at least one piece of the following information:
1) information about a lifecycle of a component;
2) information about a data element of the component; and
3) a lifecycle of a production line.

According to a preferred solution of this embodiment, the assessment device has a remote client, and the semantic device 500 provides association semantic information that corresponds to each component to the remote client.

Specifically, when a user checks the running status and the analysis report of the assessment device by using the remote client, the semantic device 500 and the analysis device 400 may send analysis data and position semantic information that are needed to the remote client to be checked by the user.

For example, the semantic device 500 and the analysis device 400 may separately send the analysis data and position semantic information that are needed to a cloud, so that the remote client obtains corresponding data.

According to the solution of this embodiment, complete automatic assessment can be implemented without relying on experience of an expert. In addition, by performing semantic processing on a model, a user can be supported to perform a remote operation, to better adapt to diversified office scenarios.

Still referring to FIG. 2, according to a preferred solution of the present invention, the simulation device 100 establishes a corresponding component model of each component in a production line. Then, the data obtaining device 200 obtains corresponding data information of each component model in the simulation device. Then, the status monitoring device 300 generates, based on each component model in the simulation device and the corresponding data information that is of each component model and that is from the data obtaining device 200, corresponding model data of each component model. Then, the simulation device 100 calibrates, based on the model data of the status monitoring device 300, the corresponding component model of each component.

The model data includes data information that includes model information. The simulation device obtains the model data by packaging the model information and real data information.

For example, the model information may include a device name, information about a sensor of the device, a data attribute obtained by the sensor, and the like that correspond to real data information. A person skilled in the art may determine, according to an actual situation and demand, model information that needs to be adopted in the model data.

A person skilled in the art should be able to obtain a manner of calibrating a model based on real model data. This is not described herein again.

According to the solution in this embodiment, by simulating a production line, and outputting a data element and an event rule that are needed by a key module, a system can be automatically directed to obtain corresponding real data, and suitable data can be automatically collected and preprocessed. The real data is collected for calibration of a PLM system, so that a close loop is formed. In this way, a simulation model of the entire production line is more practical. In addition, a failure mode, a key module, and a measurement rule no longer rely on manual operations and experience of an expert, and instead corresponding information may be precisely provided by using the PLM system.

Each device in FIG. 2 may be implemented by using software, hardware (for example, an integrated circuit or an FPGA), or a combination thereof.

Figure 3:
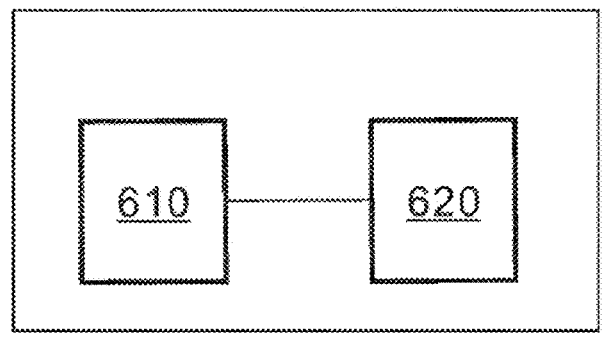
FIG. 3 is a general structural block diagram of an assessment device according to an embodiment of the present invention.

Referring to FIG. 3, FIG. 3 is a general structural block diagram of an assessment device according to an embodiment of the present invention. The assessment device may include a memory 610 and a processor 620. The memory 610 may store executable instructions. The processor 620 may implement, according to the executable instructions stored in the memory 610, the operation performed by each unit in FIG. 4-6.

In addition, an embodiment of the present invention further provides a machine-readable medium. The machine-readable medium stores executable instructions. When the executable instructions are executed, the machine is caused to perform the operations implemented by the assessment device.

A person skilled in the art should understand that the embodiments disclosed above may be varied and changed without departing from the essence of the present invention. Therefore, the protection scope of the present invention should be limited by the appended claims.

What is claimed is:

1. A method for assessing a lifecycle of a component, the method comprising:
running, using a simulation device, a simulation to determine, based on a corresponding failure mode of each component in a production line during the simulation, at least one key module in the production line, wherein the simulation is run to obtain model description information of the at least one key module, and
for a component model, the model description information is obtained by
extracting rule information corresponding to the component model using the simulation device according to the simulation of the component model in a normal mode and a failure mode, and
determining first event information corresponding to the rule information and at least one first data element corresponding to the first event information,
the model description information corresponds to at least one component model of lone or more components in the production line, and
the model description information includes (i) at least one second data element corresponding to the at least one component model and needing to be collected by the at least one component model, and (ii) second event information corresponding to each of the at least one second data element;
obtaining at least one piece of data information needed by the at least one component model corresponding to the model description information;
adding an event marking on to the at least one piece of data information based on the second event information;
obtaining component status information of a corresponding component of each component model based on the at least one piece of data information with the event marking; and
generating a corresponding analysis report based on the component status information obtained from a status monitoring device.

2. The method of claim 1, further comprising:
obtaining association semantic information of a corresponding component; and wherein the generating includes generating the corresponding analysis report based on the component status information obtained from the status monitoring device and the association semantic information of the corresponding component.

3. The method of claim 1, further comprising:
reading, after the simulation device at least one of establishes or updates simulation and modeling of the production line, position association information among each component model and other components of the component models in the simulation device, and
performing semantic processing to obtain position semantic information of the position association information among each component model and the other components of the component models in the simulation device.

4. The method of claim 1, further comprising:
providing position semantic information, corresponding to each component, to a remote client.

5. The method of claim 1, further comprising:
preprocessing the at least one piece of data information to add the event marking.

6. The method of claim 1, further comprising:
establishing corresponding component model information of each component in the production line;
obtaining corresponding real data information of each component model in the simulation device;
generating corresponding model data of each component model based on each component model in the simulation device and the corresponding real data information of each component model; and
calibrating the corresponding component model based on the corresponding model data.

7. An assessment device for assessing a lifecycle of a component, the assessment device comprising:
a simulation device including first processing circuitry, the simulation device configured to run a simulation to determine, based on a corresponding failure mode of each component in a production line during the simulation, at least one key module in the production line, wherein
the simulation is run to obtain model description information of the at least one key module,
for a component model, the model description information is obtained by
extracting rule information corresponding to the component model using the simulation device according to the simulation of the component model in a normal mode and a failure mode, and
determining first event information corresponding to the rule information and at least one first data element corresponding to the first event information,
the model description information corresponds to at least one component models of lone or more components in the production line, and
the model description information includes (i) at least one second data element corresponding to the at least one component model and needing to be collected by the at least one component model, and second event information corresponding to each of the at least one second data element;
a data obtaining device including second processing circuitry, the data obtaining device configured to obtain at least one piece of real data information needed by at least one component model corresponding to the model description information, and to add an event marking to the at least one piece of real data information based on the second event information;
a status monitoring device including third processing circuitry, the status monitoring device configured to obtain component status information of a corresponding component of each at least one component model based on the at least one piece of data information with the event marking; and
an analysis device including fourth processing circuitry, the analysis device configured to generate a corresponding analysis report based on the component status information.

8. The assessment device of claim 7, further comprising:
a semantic device including fifth processing circuitry, the semantic device configured to
obtain an association relationship among each component and other components of the component models in the simulation device, and
send association semantic information of a corresponding component to the analysis device; and wherein
the analysis device is configured to generate the corresponding analysis report based on the component status information and the association semantic information of the corresponding component.

9. The assessment device of claim 8, wherein the semantic device is further configured to
read, after the simulation device at least one of establishes or updates simulation and modeling of the production line, position association information among each component model and the other components of the component models in the simulation device, and
perform semantic processing to obtain position semantic information of the position association information among each component model and the other components of the component models in the simulation device.

10. The assessment device of claim 8, wherein the assessment device corresponds to a remote client, and wherein the semantic device is configured to provide the association semantic information to the remote client.

11. The assessment device of claim 7, wherein the data obtaining device is configured to preprocess the at least one piece of data information, to add the event marking to the at least one piece of data information.

12. The assessment device of claim 7, wherein
the simulation device is configured to establish a corresponding component model of each component in the production line;
the data obtaining device is configured to obtain each established component model, and obtain corresponding real data information of each component model;
the status monitoring device is configured to generate corresponding model data of each component model based on each component model in the simulation device and the corresponding real data information of each component model; and
the simulation device is configured to calibrate the corresponding component model based on the corresponding model data.

13. The assessment device of claim 8, wherein the semantic device is configured to
read, after the simulation device at least one of establishes or updates simulation and modeling of the production line, position association information among each component model and the other components of the component models in the simulation device, and perform semantic processing to obtain position semantic information of the position association information among each component model and the other components of the component models in the simulation device.

14. The assessment device of claim 8, wherein the assessment device corresponds to a remote client, and wherein the semantic device is configured to provide the association semantic information to the remote client.

15. The method of claim 2, further comprising:
reading, after the simulation device at least one of establishes or updates simulation and modeling of the production line, position association information among each component model and other components of the component models in the simulation device, and
performing semantic processing to obtain position semantic information of the position association information among each component model and other components of the component models in the simulation device.

16. The method of claim 2, further comprising:
providing position semantic information, corresponding to each component, to a remote client.

\* \* \* \* \*